United States Patent
Giles et al.

(10) Patent No.: US 7,972,947 B2
(45) Date of Patent: Jul. 5, 2011

(54) METHOD FOR FABRICATING A SEMICONDUCTOR ELEMENT, AND SEMICONDUCTOR ELEMENT

(75) Inventors: Luis-Felipe Giles, Munich (DE); Thomas Hoffmann, Leuven (BE); Chris Stapelmann, Tervuren (BE)

(73) Assignees: Infineon Technologies AG, Neubiberg (DE); IMEC VZW., Leuven (BE)

( * ) Notice: Subject to any disclaimer, the term of this patent is extended or adjusted under 35 U.S.C. 154(b) by 86 days.

(21) Appl. No.: 12/119,972

(22) Filed: May 13, 2008

(65) Prior Publication Data

US 2008/0290425 A1     Nov. 27, 2008

(30) Foreign Application Priority Data

May 14, 2007   (DE) .................. 10 2007 022 533

(51) Int. Cl.
H01L 21/425   (2006.01)
(52) U.S. Cl. ........ 438/528; 438/162; 438/407; 438/527; 438/529; 438/530; 438/532
(58) Field of Classification Search .................. 438/162, 438/407, 527–530, 532
See application file for complete search history.

(56) References Cited

U.S. PATENT DOCUMENTS

| | | | | |
|---|---|---|---|---|
| 5,900,652 | A * | 5/1999 | Battaglia et al. | 257/135 |
| 6,833,569 | B2 * | 12/2004 | Dokumaci et al. | 257/250 |
| 7,494,906 | B2 * | 2/2009 | Kammler et al. | 438/528 |
| 7,662,680 | B2 * | 2/2010 | Giles | 438/162 |
| 2003/0219954 | A1 * | 11/2003 | Baba | 438/373 |
| 2007/0161219 | A1 | 7/2007 | Giles | |

FOREIGN PATENT DOCUMENTS

DE   10 2005 054 218 A1   5/2007

OTHER PUBLICATIONS

Boninelli, S., et al., "Evidences of F-induced nanobubbles as sink for self-interstitials in Si," Applied Physics Letters, 2006, pp. 171916-1-171916-3, vol. 89, American Institute of Physics.
Colombeau, B., et al., "Electrical Deactivation and Diffusion of Boron in Preamorphized Ultrashallow Junctions: Interstitial Transport and F co-implant Control," 2004, 4 pages, IEEE.
Giles, L.F., et al., "Transient enhanced diffusion of B at low temperatures under extrinsic conditions," Solid-State Electronics, 2005, pp. 618-627, vol. 49, Elsevier Ltd.
Mannino, G., et al., "Electrical activation of B in the presence of boron-interstitials clusters," Applied Physics Letters, Dec. 3, 2001, pp. 3764-3766, vol. 79, No. 23, American Institute of Physics.
Sze, S.M., "Physics of Semiconductor Devices," A Wiley-Interscience Publication, 1981, 3 pages, John Wiley & Sons, Inc.

* cited by examiner

*Primary Examiner* — Kevin M Picardat
*Assistant Examiner* — Bac H Au
(74) *Attorney, Agent, or Firm* — Slater & Matsil, L.L.P.

(57) ABSTRACT

In a method for fabricating a semiconductor element in a substrate, first implantation ions are implanted into the substrate, whereby micro-cavities are produced in a first partial region of the substrate. Furthermore, pre-amorphization ions are implanted into the substrate, whereby a second partial region of the substrate is at least partly amorphized, and whereby crystal defects are produced in the substrate. Furthermore, second implantation ions are implanted into the second partial region of the substrate. Furthermore, the substrate is heated, such that at least some of the crystal defects are eliminated using the second implantation ions. Furthermore, dopant atoms are implanted into the second partial region of the substrate, wherein the semiconductor element is formed using the dopant atoms.

21 Claims, 12 Drawing Sheets

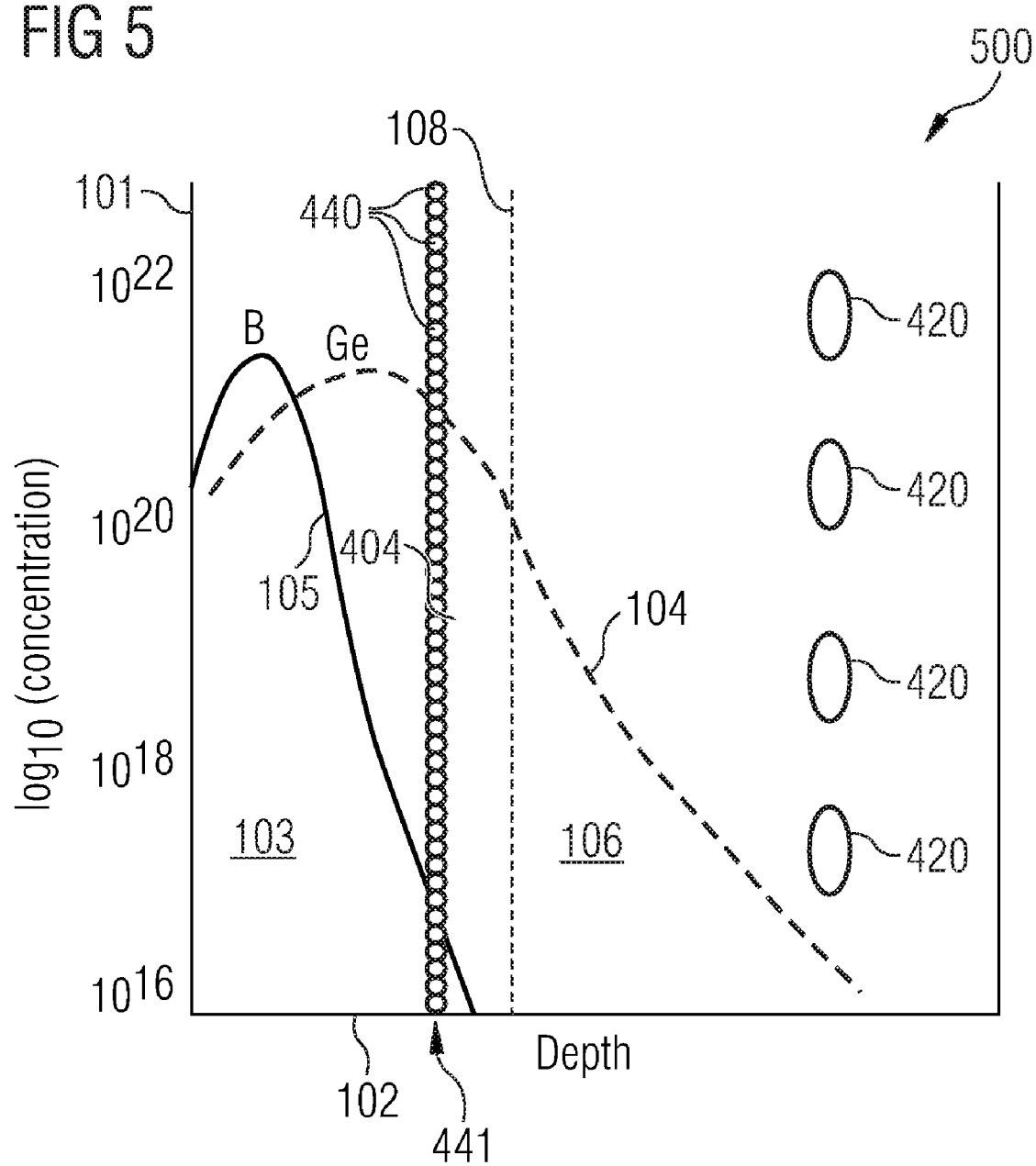

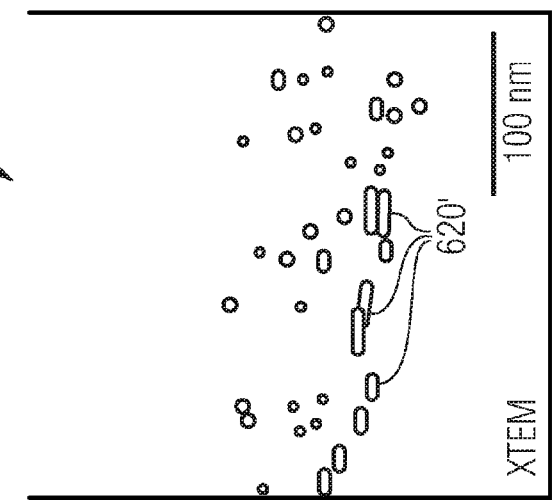
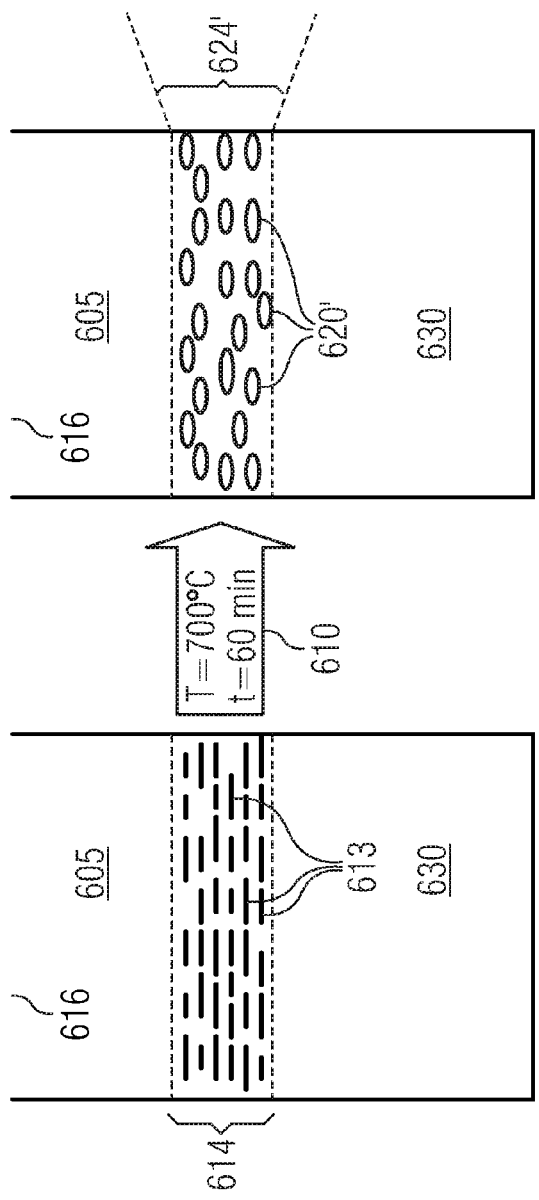

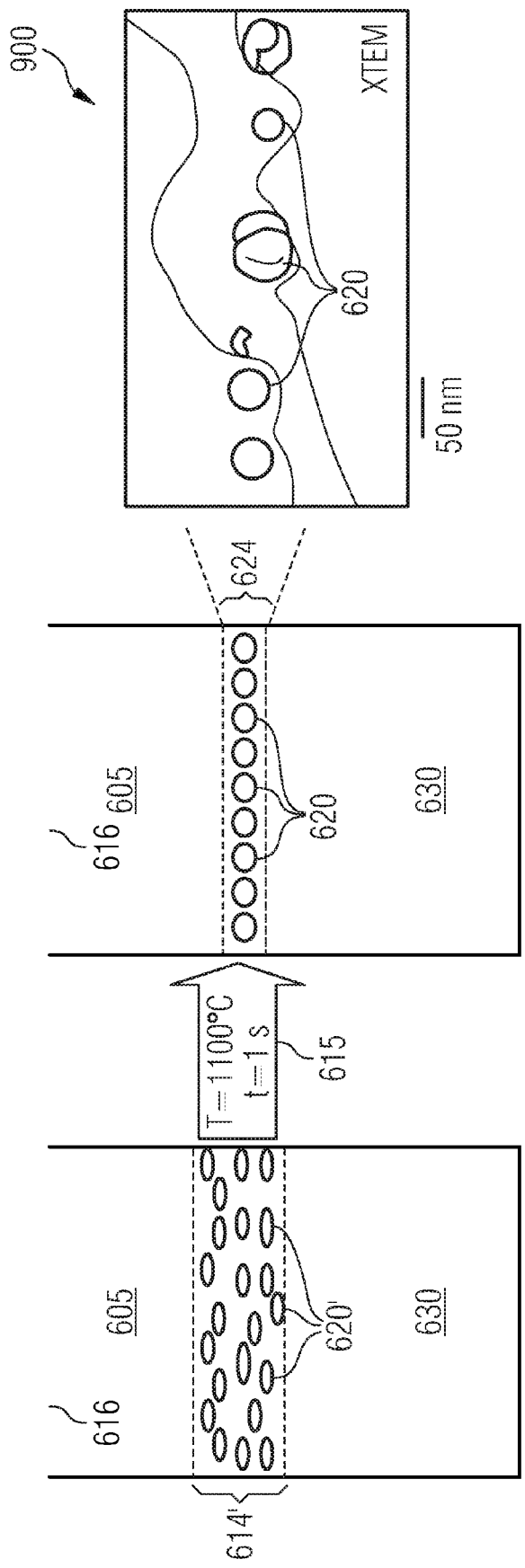

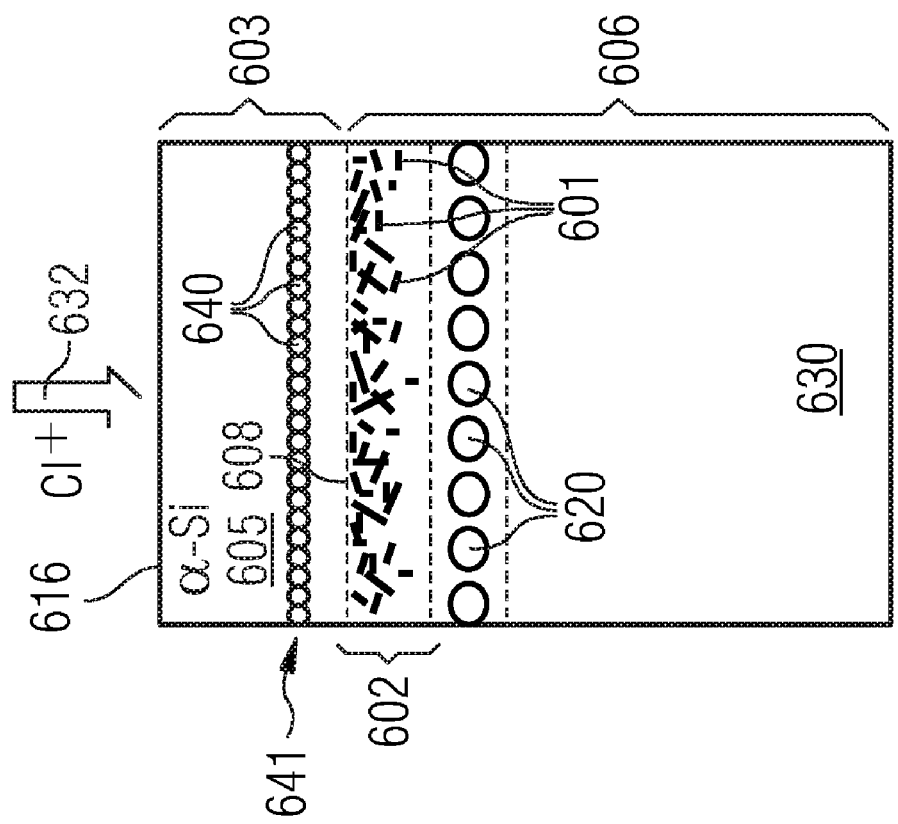
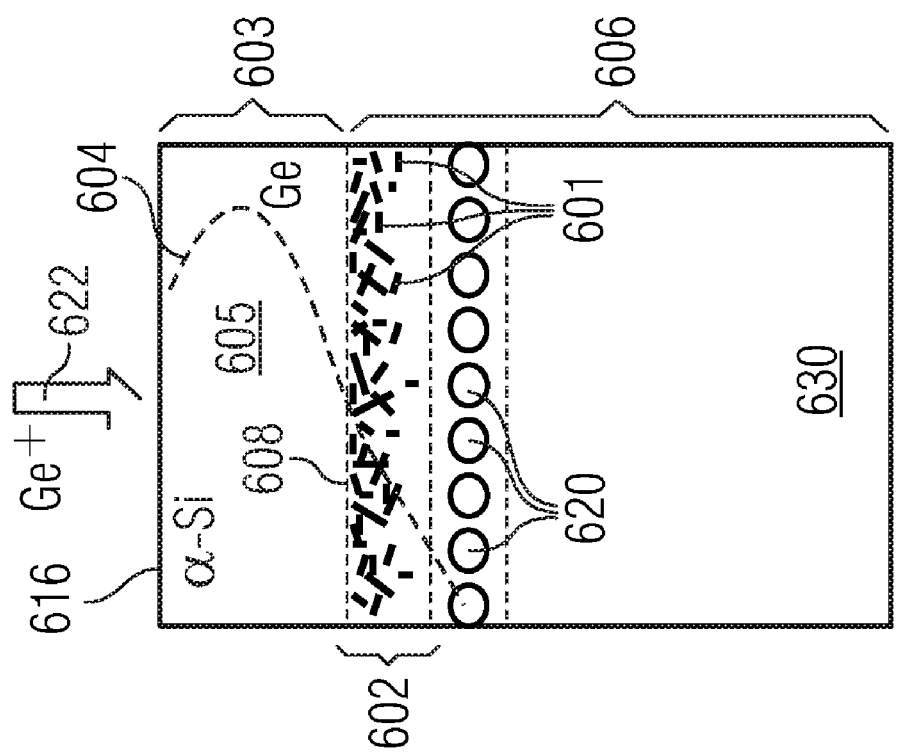

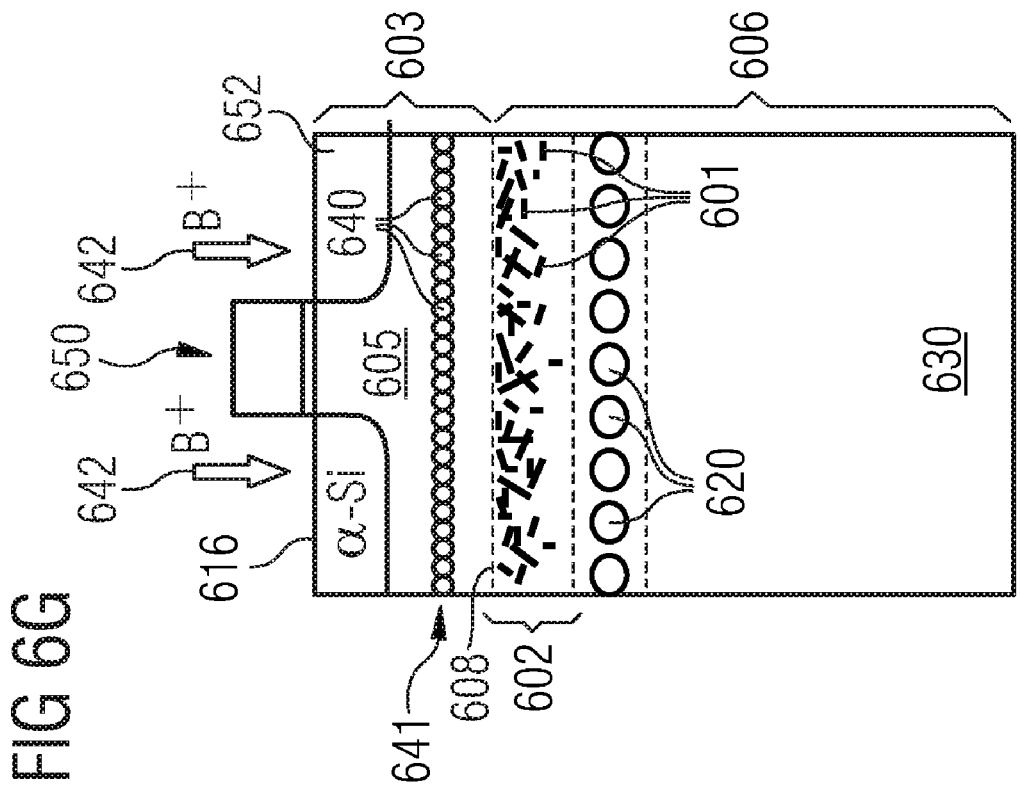
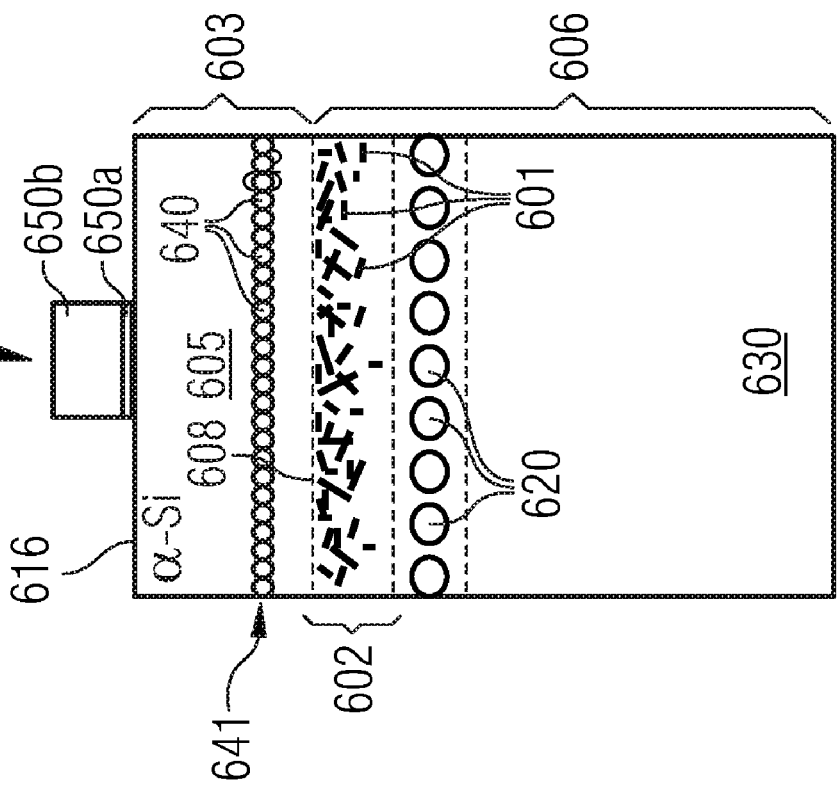

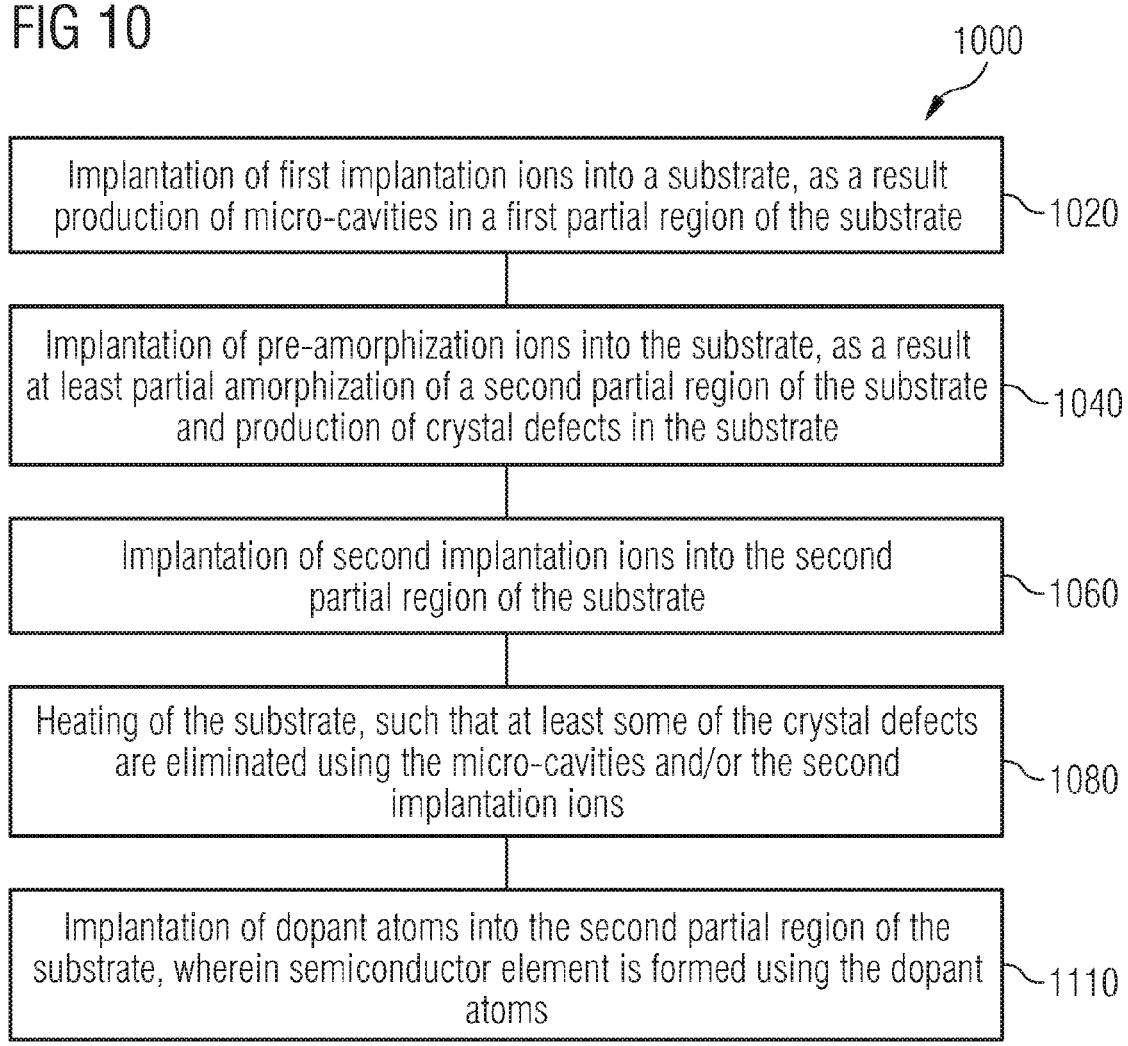

METHOD FOR FABRICATING A SEMICONDUCTOR ELEMENT, AND SEMICONDUCTOR ELEMENT

This application claims priority to German Patent Application 10 2007 022 533.6, which was filed May 14, 2007 and is incorporated herein by reference.

TECHNICAL FIELD

Embodiments of the invention relate generally to semiconductor elements and fabrication methods thereof, and, in accordance with some embodiments, to reducing crystal defects in semiconductor elements.

BACKGROUND

In accordance with the International Technology Roadmap for Semiconductors (ITRS), for the 45 nm technology node 7 nm deep ultra-shallow junctions, e.g., ultra-shallow $p^+/n$ junctions, having a sheet resistance of less than $1000\Omega/\square$ are envisaged, for example, for a transistor.

When producing ultra-shallow junctions for sub-45 nm technologies, a shallow dopant implantation is commonly used for forming shallow junction profiles. Since, when implanting dopants into a crystalline silicon substrate, specific dopants or dopant species such as boron (B), for example, may diffuse more deeply into the crystalline silicon on account of the so-called channeling effect, oftentimes the silicon is amorphized prior to the dopant implantation (so-called pre-amorphization). This may be done, for example, by means of a germanium or silicon implantation (so-called pre-amorphization implantation, PAI). By means of a PAI it may be possible, moreover, for excess silicon interstitials (Si interstitials) produced during the implantation deep in the substrate at the end of the germanium or silicon implantation profile to be spatially confined (confinement). The silicon interstitials are clearly instances of damage to the silicon crystal lattice structure in the form of silicon atoms which are situated at positions between the actual regular lattice sites of the crystal lattice, i.e., at interstices.

On account of a coarsening process, however, in the boundary region or at the interface between the amorphized partial region and the crystalline partial region of the silicon (also referred to as amorphous/crystalline silicon interface), there arise from the interstitials extended defects, also referred to as end-of-range defects or EOR defects. On account of the EOR defects, a local supersaturation of interstitials occurs, which rapidly propagates both in the direction of the substrate surface and in the direction of the silicon bulk. The resulting flow of interstitials from the EOR defect region in the direction of the substrate surface may be regarded as a cause of a transient enhanced diffusion (TED) and of the deactivation of dopants such as, for example, boron (dopant deactivation). It is widely accepted among experts here that the deactivation of the dopant atoms occurs on account of the formation of immobile dopant interstitial clusters at low temperatures.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a second diagram illustrating a functional principle of certain embodiments;

FIG. 6A to FIG. 6H show different views illustrating a method for fabricating a field-effect transistor in accordance with an embodiment;

FIG. 8 shows a first XTEM micrograph of micro-cavities;

FIG. 9 shows a second XTEM micrograph of micro-cavities; and

FIG. 10 shows a method for fabricating a semiconductor element in a substrate in accordance with an embodiment.

DETAILED DESCRIPTION OF ILLUSTRATIVE EMBODIMENTS

Figure 1:
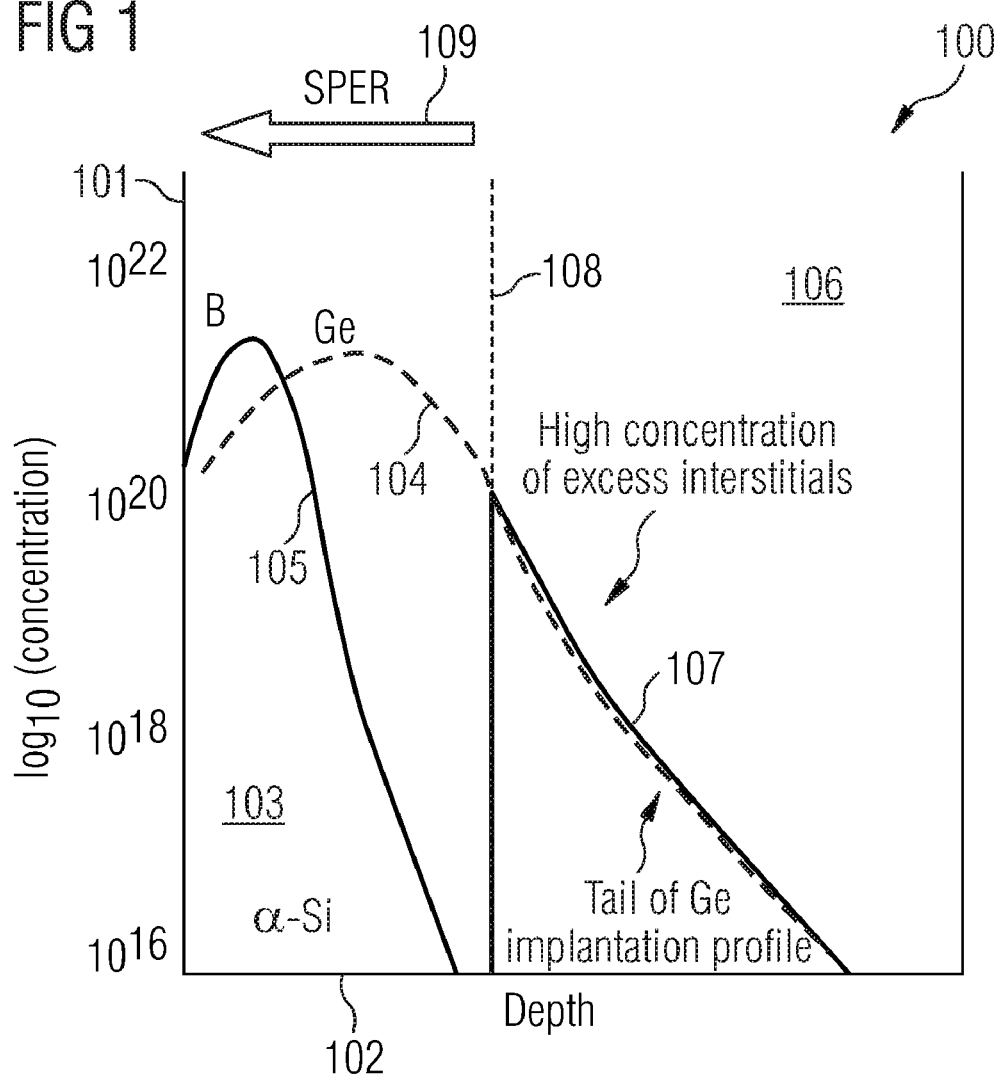
FIG. 1 shows a diagram illustrating a pre-amorphization of a substrate.

In a method for fabricating a semiconductor element in a substrate in accordance with one embodiment, first implantation ions are implanted into the substrate, whereby micro-cavities are produced in a first partial region of the substrate. Furthermore, pre-amorphization ions are implanted into the substrate, whereby a second partial region of the substrate is at least partly amorphized, and whereby crystal defects are produced in the substrate. Furthermore, second implantation ions are implanted into the second partial region of the substrate. Furthermore, the substrate is heated, such that at least some of the crystal defects are eliminated using the micro-cavities and/or the second implantation ions. Furthermore, dopant atoms are implanted into the second partial region of the substrate, wherein the semiconductor element is formed using the dopant atoms.

A semiconductor element in accordance with one embodiment includes a substrate, and also at least one shallow doped region arranged in an amorphous partial region of the substrate. Furthermore, the semiconductor element includes micro-cavities in the substrate below the amorphous partial region of the substrate. Furthermore, the semiconductor element includes reactive ions in the amorphous partial region of the substrate below the at least one shallow doped region.

In accordance with some embodiments, the number of crystal defects, especially interstitials, in a semiconductor element may be reduced by means of introducing first implantation ions and second implantation ions into the substrate. In the context of this application, interstitials may be understood to be a specific type of one-dimensional point defects in a crystal lattice. Specifically, an interstitial may denote an atom which is not situated at a regular lattice site of the crystal lattice, but rather in between, i.e., at an interstice. If the atom situated at the interstice and the atoms of the crystal lattice are atoms of the same species, then the term self-interstitial may also be employed, for example, in the case of a silicon interstitial ($Si^i$) in a silicon crystal lattice. In the context of this application, the terms "self-interstitial", "interstitial" and "interstitial-like" defect are used synonymously.

In accordance with another embodiment, micro-platelets may be formed in the first partial region of the substrate by means of the process of implanting the first implantation ions, wherein the micro-cavities are formed from the micro-platelets.

In accordance with another embodiment, light ions may be used as first implantation ions.

In the context of this application, light ions may generally be understood to be ions having a low mass or having a small mass number, for example, light non-doping ions.

In accordance with one embodiment, hydrogen ions ($H_2^+$ ions) and/or helium ions ($He^+$ ions) and/or neon ions ($Ne^+$ ions) and/or fluorine ions ($F^+$ ions) may be used as light ions.

The light ions implanted into the substrate clearly may have the tendency to break covalent bonds in the substrate (e.g., covalent silicon bonds in a silicon substrate) (essentially by ionization), whereby thin platelets may be formed in supersaturated regions. The thin platelets, which are also referred to as micro-platelets in the context of this application, may be stretched along the {100} planes of the substrate. To put it another way, platelet-like defects or lattice defects may be produced in the crystal lattice of the substrate (e.g., in the crystal lattice of a silicon wafer) as a result of the implantation of light ions. In this case, the micro-platelets may be formed in the vicinity of the maximum or peak of the light ion concentration in the substrate. The depth $R_p$ of the concentration maximum of the implanted light ions is referred to as the projected range $R_p$, where depth may be understood to be the distance from the substrate surface. It follows from the above that the concentration of the micro-platelets is also maximal in the vicinity of $R_p$.

The micro-platelets may be stretched along a plane of symmetry of the substrate, depending on the orientation of the substrate surface. By way of example, the platelets may be stretched along the (100) plane in the case of a silicon substrate (silicon wafer) having a (100) surface orientation, and correspondingly along the (111) plane in the case of a (111) substrate (wafer), wherein the length of the micro-platelets (i.e., the extent parallel to the above-mentioned plane of symmetry) follows a distribution with a mean value and a standard deviation which may depend, for example, on the implantation dose $\Phi$ and/or on the implantation energy E of the implanted light ions.

The dimensions of the micro-platelets may depend on the implantation conditions (e.g., implantation dose and/or implantation energy) and the conditions during an annealing step. In general, the length and the width of the micro-platelets may be of the order of magnitude of approximately 10 nm, and the height (i.e., the extent perpendicular to the above-mentioned plane of symmetry) of the micro-platelets may be of the order of magnitude of approximately 0.54 nm.

In addition, the depth and the extent of the region in which the micro-platelets are formed may be influenced with the aid of the implantation dose $\Phi$ and/or the implantation energy E of the light ions. In this connection, depth once again means the distance from the substrate surface, and extent means the extent in the direction of the normal to the surface, i.e., the extent along the [100] direction in the case of a (100) substrate.

In other words, by varying the two parameters of dose $\Phi$ and energy E (and possibly other parameters), it may be possible to influence the depth $R_p$ (Projected Range) of the light ion concentration maximum and consequently the position and/or the extent of the region in which micro-platelets may be formed. By way of example, the light ions may be implanted with a dose and/or energy such that the range $R_p$ of the light ions and thus the region with the micro-platelets lie deeper in the substrate than a region with end-of-range (EOR) defects or EOR damage.

In accordance with another embodiment, when using an approximately 10 nm thick screen oxide during an $H_2^+$ ion implantation, for example, with an implantation energy E=10 keV and an implantation dose $\Phi=10^{16}$ cm$^{-2}$, a depth $R_p$ of approximately 100 nm may be achieved.

In accordance with another embodiment, an additional mask may be used when implanting the light ions. The mask may serve to limit the lateral extent of the region in which micro-platelets are formed. Clearly, the use of the mask makes it possible to block the implantation of the light ions in predetermined regions of the substrate, such that no micro-platelets may be formed in the predetermined regions.

In accordance with one embodiment, a hard mask composed of an oxide material and a nitride material may be used as a mask during the light ion implantation. As an alternative, other suitable masks or mask materials may be used.

Introducing light ions into the substrate in order to form the micro-platelets or the micro-cavities constitutes a simple and reliable mechanism for fabricating the micro-cavities which is process-compatible with present-day CMOS processes (Complementary Metal Oxide Semiconductor).

In the context of this application, a micro-cavity may be understood to be a cavity in the substrate having an extent in the microns range in all spatial directions, alternatively having an extent in the microns range in two spatial directions and having an extent in the nanometers range in one spatial direction, alternatively having an extent in the microns range in one spatial direction and having an extent in the nanometers range in two spatial directions, alternatively having an extent in the nanometers range in all spatial directions. A micro-cavity having an extent in the nanometers range in all spatial directions may also be referred to as a nano-cavity. The term micro-cavity is used hereinafter, where this is assumed also to encompass nano-cavities, i.e., cavities having dimensions in the nanometers range in all spatial directions.

In accordance with another embodiment, the micro-cavities may be formed in such a way that they have a width of, for example, about 5 nm to about 100 nm or several 100 nm, for example, about 10 nm to about 100 nm or several 100 nm, and also a length of about 20 nm to about 100 nm or several 100 nm, and also a height of about 10 nm to about 100 nm or several 100 nm, for example, approximately 50 nm.

The size and the density of the micro-cavities may be controlled by means of the method steps described above. The size of the micro-cavities may scale with the dimensions of the semiconductor element and be correspondingly optimized for predetermined dimensions of the semiconductor element.

In accordance with another embodiment, the light ions may be implanted with an implantation dose of between $10^{13}$ cm$^{-2}$ and $10^{17}$ cm$^{-2}$.

In accordance with another embodiment, the light ions may have an implantation energy of approximately 5 keV to 60 keV.

In accordance with another embodiment, as light ions $H_2^+$ ions may be implanted with an implantation dose of between $10^{13}$ cm$^{-2}$ and $10^{17}$ cm$^{-2}$ and with an implantation energy of between 5 keV and 40 keV.

In accordance with another embodiment, as light ions $He^+$ ions may be implanted with an implantation dose of between $10^{13}$ cm$^{-2}$ and $10^{17}$ cm$^{-2}$ and with an implantation energy of between 5 keV and 40 keV.

In accordance with another embodiment, as light ions $Ne^+$ ions may be implanted with an implantation dose of between $10^{13}$ cm$^{-2}$ and $5\times10^{16}$ cm$^{-2}$ and with an implantation energy of between 10 keV and 40 keV.

In accordance with another embodiment, as light ions $F^+$ ions may be implanted with an implantation dose of between $10^{14}$ cm$^{-2}$ and $5 \times 10^{16}$ cm$^{-2}$ and with an implantation energy of between 5 keV and 60 keV.

In accordance with another embodiment, the substrate with the micro-platelets may be subjected to a first thermal treatment, such that the micro-cavities are formed from the micro-platelets. In other words, the substrate (e.g., the wafer) may be heat-treated or heated, or to put it in yet another way, a so-called annealing step may be carried out.

The first thermal treatment may be configured, for example, as a low temperature treatment (e.g., as a low temperature anneal), to put it another way using a low thermal budget.

In accordance with another embodiment, the substrate may be heated to a temperature of between 600° C. and 800° C., for example, to a temperature of approximately 700° C., in the context of the first thermal treatment.

In accordance with another embodiment, the substrate may be heated for a duration of between 10 min and 2 h, for example, for a duration of approximately 60 min, in the context of the first thermal treatment.

In accordance with another embodiment, the substrate may be heated to a temperature of approximately 700° C. for a duration of approximately 60 min in the context of the first thermal treatment.

Clearly, an outdiffusion of hydrogen, helium, neon or fluorine from the substrate may occur on account of the first thermal treatment, depending on whether $H_2^+$ ions, $He^+$ ions, $Ne^+$ ions or $F^+$ ions were implanted as light ions into the substrate beforehand. This outdiffusion of the implanted light ions in the form of neutral atoms or molecules leads to the formation of a network or band, or to put it another way a strip-type region, of micro-cavities from the micro-platelets in the vicinity of the range $R_p$ of the implanted light ions.

Both the size and the density of the micro-cavities formed depend on the process parameters of the light ion implantation described above (parameters: dose $\Phi$, energy E), and of the first thermal treatment (parameters: temperature T, time duration t). The process parameters may be chosen or optimized in such a way that the density and the size of the micro-cavities in each case remain below predetermined threshold values, such that detachment or delamination of the silicon substrate does not occur. In other words, the density and/or the size of the micro-cavities may be small enough such that the cohesion of the substrate may be ensured and layer delamination may thus be avoided.

In accordance with some embodiments, the use of a low thermal budget during the first thermal treatment may prevent the micro-cavities formed from disintegrating.

In accordance with another embodiment, the substrate may be subjected to a second thermal treatment after the first thermal treatment, in the course of the second thermal treatment the size of the micro-cavities formed may be increased and/or the number of micro-cavities formed may be reduced.

The second thermal treatment may be configured, for example, as a high temperature heat treatment (high temperature anneal) and/or as a short-time heat treatment (e.g., rapid thermal anneal (RTA) or rapid thermal processing (RTP)), to put it another way using a high thermal budget.

In accordance with another embodiment, the substrate may be heated to a temperature of between 1000° C. and 1300° C. in the context of the second thermal treatment, for example, to a temperature of approximately 1100° C.

In accordance with another embodiment, the substrate may be heated for a duration of between 1 μs and 1 s in the context of the second thermal treatment, for example, for a duration of approximately 1 s.

In accordance with another embodiment, the substrate may be heated to a temperature of approximately 1100° C. for a duration of approximately 1 s in the context of the second thermal treatment.

Clearly, a conservative ripening process of the micro-cavities may be brought about by means of the second thermal treatment, which process, proceeding from the band or network of micro-cavities formed after the first thermal treatment, forms a thinner band with larger micro-cavities. In this connection, conservative may be understood to mean that the total volume of the micro-cavities may be maintained during the ripening process. From a large number of relatively small micro-cavities, a smaller number of larger micro-cavities may be formed during the ripening process. This may clearly take place by two or more small micro-cavities "merging" to form a larger micro-cavity. This process may also be referred to as a coarsening process.

In accordance with one embodiment, the thinner band formed after the ripening process or after the second thermal treatment has a thickness of approximately 20 nm to 100 nm, wherein the micro-cavities in the thinner band may have a size of approximately 40 nm, for example, and wherein the density of the micro-cavities in the thinner band may be approximately $10^{11}$ cm$^{-3}$, for example.

In accordance with another embodiment, the band with micro-cavities may be formed in such a way (for example, using a suitable implantation energy and thus a suitable range $R_p$ of the implanted light ions) that it is formed deeper in the substrate than an amorphous/crystalline interface formed by the implantation of the pre-amorphization ions.

In accordance with another embodiment, the pre-amorphization ions may be implanted after the process of forming the micro-cavities.

In the context of this application, pre-amorphization ions may generally be understood to be implantation ions with the aid of which at least a partial region of a crystalline substrate may be amorphized or pre-amorphized. To put it another way, the crystal structure of at least a partial region of a substrate which originally is, for example, fully crystalline or monocrystalline may be destroyed with the aid of the pre-amorphization ions in the context of a pre-amorphization implantation (PAI).

In accordance with another embodiment, germanium ions ($Ge^+$ ions) may be used as pre-amorphization ions.

In accordance with another embodiment, the germanium ions may be implanted with an implantation dose of between $10^{14}$ cm$^{-2}$ and $10^{15}$ cm$^{-2}$.

In accordance with another embodiment, the germanium ions may have an implantation energy of approximately 20 keV to 50 keV.

In accordance with another embodiment, silicon ions ($Si^+$ ions) may be used as pre-amorphization ions.

In accordance with another embodiment, the silicon ions may be implanted with an implantation dose of between $10^{14}$ cm$^{-2}$ and $5 \times 10^{15}$ cm$^{-2}$.

In accordance with another embodiment, the silicon ions may have an implantation energy of approximately 10 keV to 60 keV.

In accordance with another embodiment, the second implantation ions may be implanted after the process of implanting the pre-amorphization ions.

In accordance with another embodiment, the process of implanting the second implantation ions may be effected together, in other words simultaneously, with the process of implanting the pre-amorphization ions.

In accordance with another embodiment, reactive ions may be used as second implantation ions.

In the context of this application, reactive ions or highly reactive ions may generally be understood to be ions which form pairs or clusters with interstitials, to put it another way ions which clearly "react" with the interstitials.

In accordance with another embodiment, chlorine ions ($Cl^+$ ions) and/or carbon ions ($C^+$ ions) and/or nitrogen ions ($N^+$ ions) may be used as reactive ions. As an alternative or in addition, other suitable reactive ions may be used.

Clearly, in accordance with one embodiment, by means of implanting highly reactive ions, a band or a layer with highly reactive ions may be formed in the amorphized partial region of the substrate, wherein the highly reactive ions react with diffusing interstitials and thereby trap the interstitials.

In accordance with another embodiment, the highly reactive ions may be implanted in such a way that the layer with the highly reactive ions is formed in the vicinity of a region into which dopant atoms (e.g., boron atoms, phosphorus atoms, arsenic atoms or other dopant atoms) are implanted in the context of a dopant implantation for producing a junction (e.g., a $p^+$/n junction) in the semiconductor element, wherein the layer may however be formed sufficiently far away from the junction (e.g., the $p^+$/n junction), such that, for example, the occurrence of leakage currents may be avoided.

In accordance with another embodiment, the reactive ions may be implanted with an implantation dose of between $10^{13}$ cm$^{-2}$ and $5\times10^{16}$ cm$^{-2}$.

In accordance with another embodiment, the reactive ions may have an implantation energy of approximately 4 keV to 50 keV.

In accordance with another embodiment, as reactive ions $Cl^+$ ions may be implanted with an implantation dose of between $10^{13}$ cm$^{-2}$ and $5\times10^{16}$ cm$^{-2}$ and with an implantation energy of between 10 keV and 50 keV.

In accordance with another embodiment, as reactive ions $C^+$ ions may be implanted with an implantation dose of between $10^{13}$ cm$^{-2}$ and $5\times10^{16}$ cm$^{-2}$ and with an implantation energy of between 4 keV and 30 keV.

In accordance with another embodiment, as reactive ions $N^+$ ions may be implanted with an implantation dose of between $10^{13}$ cm$^{-2}$ and $5\times10^{16}$ cm$^{-2}$ and with an implantation energy of between 4 keV and 30 keV.

In accordance with another embodiment, the second implantation ions (for example the reactive ions) may be implanted in such a way that the implanted ions are at a distance of approximately 10 nm to 100 nm from the amorphous/crystalline interface, i.e. the interface between the at least partly amorphized second partial region and a crystalline partial region of the substrate that is formed below the second partial region. To put it another way, the implantation parameters, in particular the implantation energy, of the second implantation ions may be chosen in such a way that the range (projected range, $R_p$) of the second implantation ions lies within the amorphized second partial region of the substrate, wherein the distance between the maximum of the implantation profile and the amorphous/crystalline interface in the substrate may be, for example, approximately 10 nm to 100 nm, for example approximately 30 nm to 70 nm, for example approximately 50 nm.

In accordance with another embodiment, the dopant atoms may be implanted after the process of implanting the second implantation ions (for example, the reactive ions).

In accordance with another embodiment, boron atoms, phosphorus atoms or arsenic atoms may be used as dopant atoms. As an alternative, other suitable dopant atoms may be used.

In accordance with another embodiment, the boron atoms may be implanted into the second partial region of the substrate by introducing or implanting elemental boron (B) or boron fluoride ($BF_2$) or boron clusters (e.g., $BF_2$, $B_xH_y$ or $B_xC_y$) into the second partial region of the substrate.

Clearly, in accordance with embodiments, a shallow or ultra-shallow dopant implantation may be effected, for example, using a boron implantation with a very low implantation energy (e.g., ultra-low energy boron implant). A shallow or ultra-shallow doped region may thereby be formed in the substrate, for example, in the amorphized second partial region closely beneath the substrate surface. The shallow or ultra-shallow doped region may extend, for example, from the substrate surface as far as a depth of approximately 10 nm to 20 nm.

In accordance with another embodiment, the substrate is subjected to a third thermal treatment after the dopant atoms have been implanted, such that the at least partly amorphized second partial region is at least partly recrystallized.

In accordance with another embodiment, the substrate is heated to a temperature of between 550° C. and 700° C. in the context of the third thermal treatment, for example, to a temperature of approximately 600° C.

In accordance with another embodiment, the substrate is heated for a duration of between 10 min and 2 h in the context of the third thermal treatment, for example, for a duration of approximately 30 min.

Clearly, at least partial recrystallization of the previously amorphized partial region of the substrate may be achieved in the context of a solid phase epitaxial regrowth (SPER) process using a low temperature treatment (for example, low temperature anneal).

In accordance with another embodiment, at least one region of the second partial region into which the dopant atoms are implanted may form a shallow doped region of the semiconductor element, wherein the shallow doped region clearly forms a partial region of a shallow junction or of an ultra-shallow junction, for example, of an ultra-shallow $p^+$/n junction, in the semiconductor element. The shallow doped region may be formed as a highly doped region, for example, as a highly p-doped (e.g., $p^+$-doped) region, alternatively as a highly n-doped (e.g., $n^+$-doped) region.

In accordance with another embodiment, a transistor may be formed as a semiconductor element.

In accordance with another embodiment, a field-effect transistor may be formed as a semiconductor element.

In accordance with another embodiment, at least one region of the second partial region into which the dopant atoms are implanted may form a source region or a drain region of the field-effect transistor.

In accordance with another embodiment, a first region of the second partial region into which the dopant atoms are implanted may form a source region of the field-effect transistor, and a second region of the second partial region into which the dopant atoms are implanted may form a drain region of the field-effect transistor.

In this connection, precisely in future technology nodes when forming ultra-shallow junctions as a source region or as a drain region, there is the problem of interstitials produced in the vicinity of the interface between amorphous partial region and the crystalline partial region of the substrate and a resultant increased diffusion of the dopant atoms from the source region or the drain region into the substrate, which is reduced, for example, by providing the micro-cavities below the amorphous/crystalline interface or below a region with EOR defects, and by providing the reactive ions (second implantation ions) in the amorphous region, since the micro-cavities clearly serve as a sink for interstitials, and the reactive ions furthermore eliminate such interstitials which diffuse in the direction of the substrate surface, such that the diffusion of the dopant atoms that occurs is reduced.

In accordance with another embodiment, a silicon substrate may be used as a substrate.

In accordance with another embodiment, a (100) silicon substrate or a (111) silicon substrate may be used as a substrate.

In accordance with some embodiments, the implantation of the first implantation ions and/or of the second implantation ions may be integrated into a conventional CMOS process flow, for example, a CMOS logic/DRAM process flow, for example, before or after the formation of a gate stack of a field-effect transistor.

In accordance with one embodiment, the micro-cavities may be formed before the process of forming the gate region or gate stack of the field-effect transistor. One effect of this embodiment is that the first implantation ions may be implanted with high implantation energy and thus deeply into the substrate, without, for example, a mask being required in order to protect the gate stack of the field-effect transistor against damage due to the high-energy ions. This may reduce, for example, the costs and the complexity of the fabrication process.

In accordance with another embodiment, the at least one shallow doped region forms the source region and/or the drain region of the field-effect transistor.

In accordance with some embodiments, the micro-cavities formed in the substrate or in the first partial region of the substrate may serve as a sink for the crystal defects (i.e., the interstitials) occurring in the substrate in the context of introducing or implanting the pre-amorphization ions (e.g., $Ge^+$ ions) into the crystalline substrate, such that the interstitials may be at least partially eliminated by means of the micro-cavities.

The micro-cavities formed in the crystal lattice of the substrate are thermally stable, such that they do not disappear even during a high temperature step at a temperature of more than 1000° C. that is applied to the substrate after the micro-cavities have been formed. This makes it possible, for the case where the pre-amorphization ions are introduced into the substrate after a high temperature step, for the micro-cavities to serve as a sink for eliminating the interstitials produced as a result of introducing the pre-amorphization ions.

In accordance with some embodiments, the flow of interstitials in the direction of the substrate surface may be effectively suppressed by means of combining a light ion implantation having a high dose and a high penetration depth (to put it another way deeply into the substrate) with a shallower implantation of reactive ions.

In accordance with some embodiments, a transient enhanced diffusion (TED) of the dopant atoms introduced, which is usually caused by the interstitials, may be reduced or even avoided.

To put it another way, in accordance with some embodiments, by means of a combination of two implantations (i.e., the implantation of the first implantation ions and the implantation of the second implantation ions), both the source of the interstitial diffusion, i.e., the extended EOR damage, and the diffusing interstitials themselves may be eliminated, thereby reducing both the transient enhanced diffusion (TED) and the deactivation of the dopant atoms (for example, the boron atoms), and the junction leakage current in a semiconductor element.

In accordance with some embodiments, both the implantation of the first implantation ions and the implantation of the second implantation ions may be integrated into an existing CMOS process flow in a simple manner. Furthermore, ion implanters are among conventional apparatuses in the context of a semiconductor process, such that it is, for example, not necessary to fundamentally alter the processes for fabricating the semiconductor element or even procure new apparatuses.

In the context of fabricating a field-effect transistor, after the micro-cavities have been formed, the gate insulator or the gate dielectric of the field-effect transistor may be formed, for example in the form of a gate oxide layer on the channel region of the field-effect transistor to be formed.

Clearly, in accordance with some embodiments, a thin band or a thin layer with a high concentration of micro-cavities may be formed by means of the implantation of the first implantation ions (e.g., light ions such as, for example, $H^+$ ions, $He^+$ ions, $Ne^+$ ions or $F^+$ ions) and one or more subsequent thermal treatments of the substrate. In this case, the band with micro-cavities may be formed in the vicinity of (clearly below) a region of the substrate in which interstitials or end-of-range defects (EOR defects) occur in the course of a pre-amorphization implantation. The micro-cavities clearly may serve as a sink for the interstitials and may therefore prevent the coarsening or growth of the EOR defects and hence a supersaturation of interstitials. Clearly, the source of the interstitials may be eliminated or at least greatly inhibited by means of the micro-cavities, such that a diffusion of the interstitials in the direction of the substrate surface may be completely prevented or at least greatly reduced.

In addition, in accordance with some embodiments, by means of the implantation of the second implantation ions (e.g., the highly reactive ions such as, for example, $Cl^+$ ions, $C^+$ ions or $N^+$ ions), a layer having a high concentration of highly reactive ions may be formed in the amorphous or amorphized second partial region of the substrate, wherein the highly reactive ions may suppress the diffusion of interstitials that have possibly remained in the direction of the substrate surface, since they react directly with the interstitials diffusing in the direction of the substrate surface (e.g., in the form of cluster formation). In this case, the layer with highly reactive ions may be formed in the vicinity of the amorphous/crystalline interface.

In accordance with some embodiments, process sequences are specified which may also be applied in conjunction with a $BF_2$ doping or a cluster doping (e.g., $BF_2$, $B_xH_y$, $B_xC_y$).

In accordance with some embodiments, the formation of a layer of micro-cavities by means of light ion implantation below an EOR region together with the formation of a layer with highly reactive ions in the amorphous region of the substrate in the vicinity of the amorphous/crystalline interface may lead to an effective suppression of the interstitial flow in the direction of the substrate surface, and thus to an effective suppression of TED and/or dopant atom deactivation.

In accordance with some embodiments, producing the micro-cavities prior to forming a gate module may make it possible to use a deep light ion implantation (in other words an implantation in which the light ions penetrate deeply into the substrate) and thus to produce micro-cavities far away from the region into which dopant atoms are implanted for forming a junction of the semiconductor element, and additionally below an EOR defect region. As a result, silicon self-interstitials ($Si^I$) may be trapped by means of the micro-cavities and it may be thus possible to prevent the interstitials from migrating to the surface of the substrate.

In accordance with some embodiments, the band with micro-cavities may act like a source of vacancies, i.e., unoccupied crystal lattice sites, thereby effectively reducing a supersaturation of interstitials.

In accordance with some embodiments, by means of implanting the reactive ions into the pre-amorphized second partial region of the substrate, a highly reactive layer may be formed in the amorphous side of the amorphous/crystalline interface, thereby making it possible to trap residual interstitials diffusing in the direction of the substrate surface.

In accordance with some embodiments, a transient enhanced diffusion (TED), for example, of dopants such as, e.g., boron (B) or phosphorus (P), may be suppressed better than, for example, when using a conventional co-implantation, and that furthermore effects which usually occur during a conventional co-implantation (in particular an increased junction leakage current function leakage)) may be reduced by effectively reducing the density of EOR defects.

FIG. 1 shows, in a first diagram 100, an ion concentration (in logarithmic representation ($\log_{10}$)) in a substrate, the ion concentration being represented along the ordinate 101, as a function of the depth into the substrate, the depth being represented along the abscissa 102, wherein the main processing surface of the substrate is represented by a straight line running on the ordinate 101 of the diagram 100.

It is assumed in the diagram 100 that a surface region 103 (α-Si) of the substrate has been pre-amorphized using germanium ions ($Ge^+$) as pre-amorphization ions. In the diagram 100, the concentration profile of the implanted germanium atoms is represented by means of a first curve 104. It is furthermore assumed that, following pre-amorphization, boron atoms (B) have been implanted as dopant atoms into the substrate, for example, by means of the implantation of boron ions ($B^+$ ions) or of boron fluoride ions ($BF_2^+$). The concentration profile of the implanted boron atoms is represented in a second curve 105 in the diagram 100. As can be gathered from FIG. 1, the tail of the Ge implantation profile 104 extends into the crystalline region 106 of the substrate. In other words, the germanium ions may be implanted in such a way that, after the implantation, both the amorphized region 103 of the substrate and the underlying crystalline region 106 contain germanium.

As a result of the implantation of the germanium pre-amorphization ions into the substrate, instances of crystal lattice damage (also referred to as crystal lattice defects) are produced in the crystalline region 106 of the substrate. Inter alia, instances of crystal lattice damage in the form of so-called interstitials therefore arise in the crystalline region 106 of the substrate as a consequence of the pre-amorphization implantation. The concentration profile of the interstitials is represented by means of a third curve 107 in the diagram 100 in FIG. 1.

Figure 2:
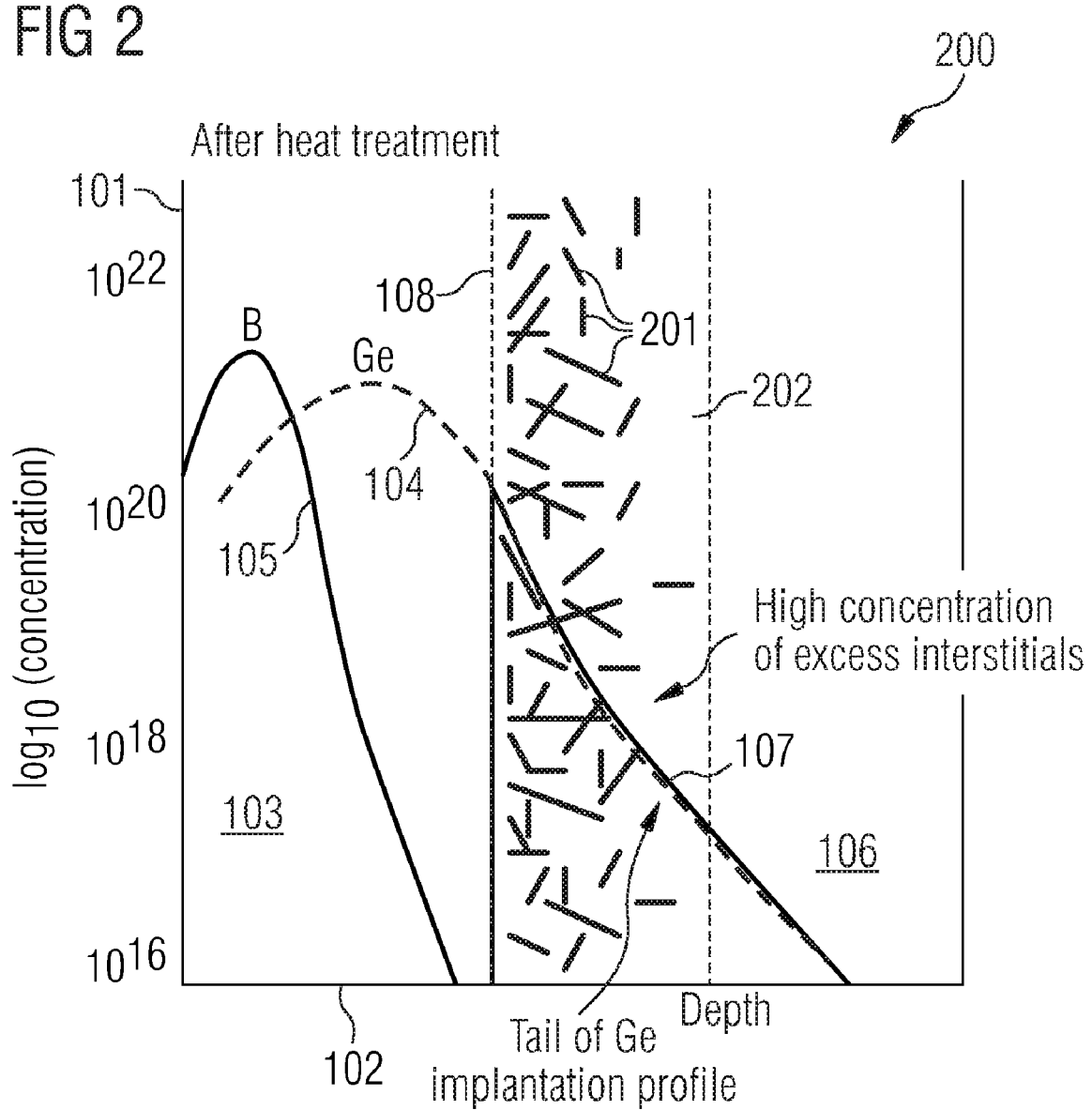
FIG. 2 shows a diagram illustrating a heating of the pre-amorphized substrate illustrated in FIG. 1 and a formation of interstitials which usually results from this.

If a heat treatment process (anneal) is subsequently carried out at a temperature of approximately 600° C. to 700° C. in order to enable a recrystallization of a partial region of the previously amorphized region 103 in the context of a solid phase epitaxial regrowth (SPER) (as illustrated by the arrow 109 in FIG. 1), some but not all of the interstitials are eliminated. In particular in the boundary region at the interface 108 between the amorphous region 103 and the crystalline region 106 of the substrate (i.e., the amorphous/crystalline interface 108) there remain so-called end-of-range interstitials 201 (end-of-range defects, EOR defects) (see second diagram 200 in FIG. 2). In other words, even after an SPER process step 109, end-of-range defects 201 remain in a region 202 the substrate corresponding to the tail of the Ge implantation profile 104 (implant tail), whereby a local supersaturation of interstitials occurs in the region.

Figure 3:
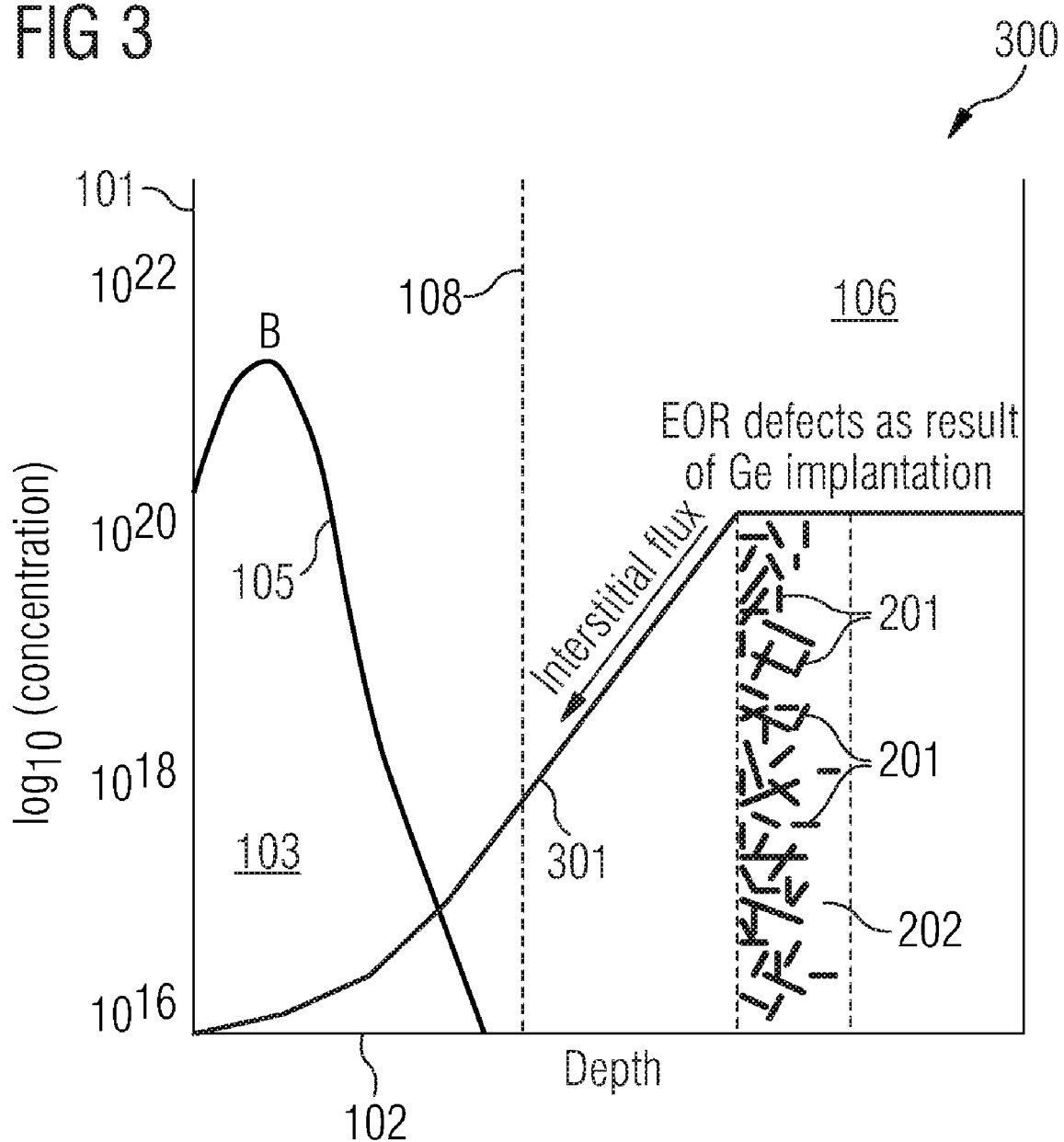
FIG. 3 shows a diagram illustrating a flow of interstitials produced in accordance with FIG. 2 in the direction of a region doped with dopant atoms.

As already explained above, some of the interstitials 201 diffuse in the direction of the main processing surface of the substrate and thus in the direction of the amorphized region 103 of the substrate. This is illustrated schematically by a fourth curve 301 in a third diagram 300 illustrated in FIG. 3.

As likewise already explained above, the interstitials 201 diffusing in the direction of the substrate surface represent a cause of a transient enhanced diffusion (TED) of dopant atoms (e.g., the boron atoms 105) and of an undesirable deactivation of the dopant atoms. Consequently, both the deactivation of the boron atoms and the TED of the boron atoms are the consequence of one and the same driving mechanism, namely the supersaturation of crystal lattice defects produced by means of the Ge pre-amorphization implantation.

Figure 4:
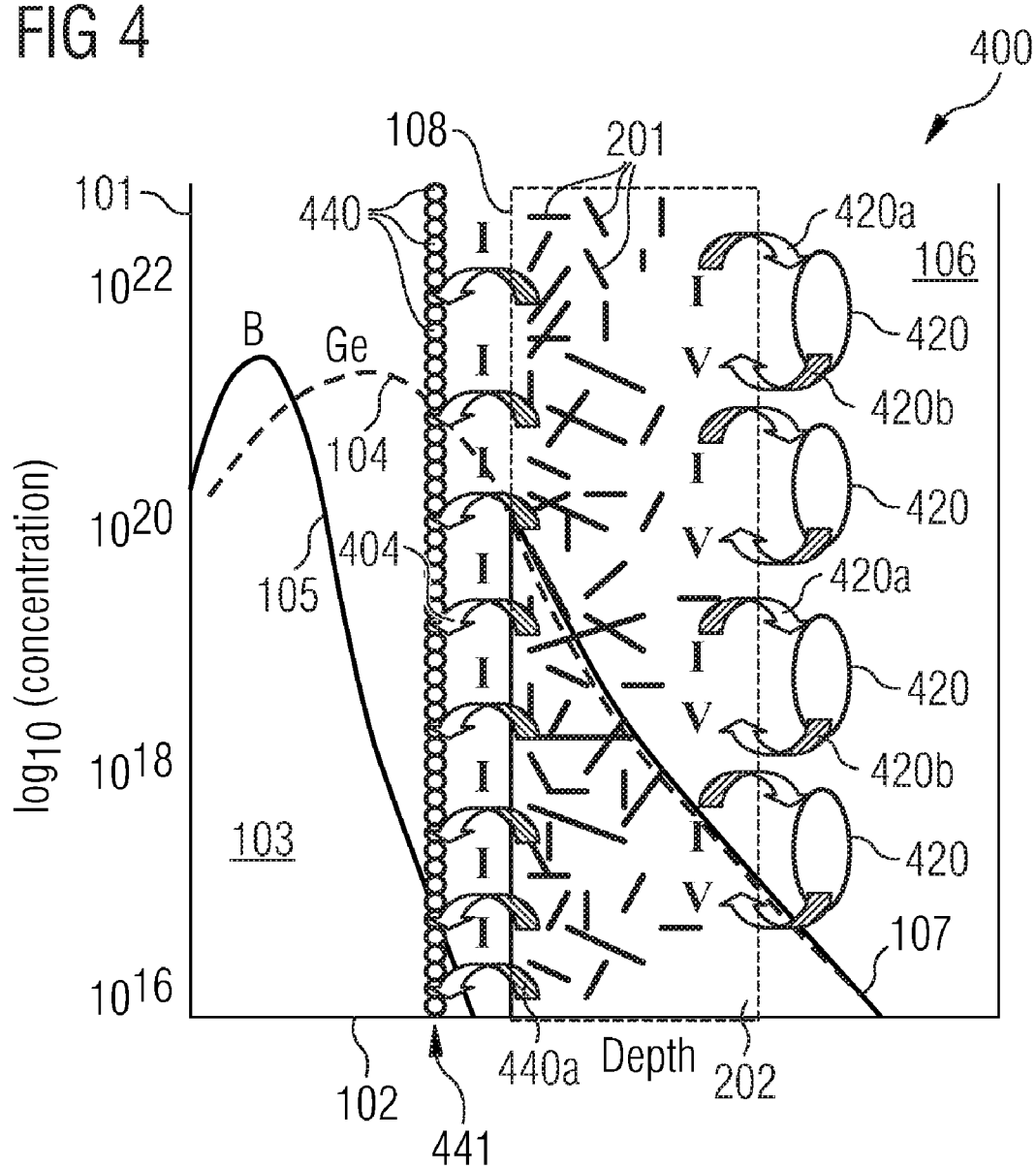
FIG. 4 shows a first diagram illustrating a functional principle of certain embodiments.

FIG. 4 schematically illustrates a functional principle underlying certain embodiments, on the basis of a fourth diagram 400.

FIG. 4 illustrates that micro-cavities 420 are formed in the crystalline region 106 of the substrate, below the region 202 in which the end-of-range defects 201 or the interstitials 201 are formed. In accordance with one embodiment, the micro-cavities 420 are formed by means of implanting first implantation ions (for example, light ions such as, e.g., $H_2^+$ ions, $He^+$ ions, $Ne^+$ ions or $F^+$ ions) prior to the implantation of the Ge pre-amorphization ions. The micro-cavities 420 are formed in the local vicinity of the expected interstitials 201 that are formed later, wherein the micro-cavities 420 are produced so close to the interstitials 201 formed later that they serve as a sink for the interstitials 201 formed later. To put it another way, the interstitials 201 are broken up, to put it in yet another way eliminated, by the micro-cavities 420 (this process is symbolized by arrows 420a, 420b in the fourth diagram 400 in FIG. 4). Clearly, the micro-cavities 420 serve as a sink for the interstitials (I) 201, which is illustrated by the arrows 420a, by virtue of the micro-cavities 420 forming a source of vacancies (V), which is illustrated by the arrows 420b.

The formation of the micro-cavities 420 below the EOR defect region 202 clearly makes it possible for the source of the interstitials 201 to be at least partially suppressed or eliminated, such that the number of interstitials 201 diffusing in the direction of the substrate surface is already considerably reduced.

This process is effected in a temperature-assisted manner in the context of a rapid thermal heating (Rapid Thermal Annealing, RTA). A very simple standard mechanism is thus used for at least partially eliminating the undesirable interstitials 201.

Laser heating or flash heating is not necessary, but may likewise be used, if desired, in alternative embodiments.

FIG. 4 furthermore illustrates that second implantation ions 440 (for example, reactive ions such as, e.g., $Cl^+$ ions, $C^+$ ions or $N^+$ ions) are introduced into the pre-amorphized region 103 of the substrate, above the region 202 in which the end-of-range defects 201 or the interstitials 201 are formed. In accordance with one embodiment, the second implantation ions 440 are introduced after the implantation of the Ge pre-amorphization ions by means of ion implantation. The second implantation ions 440 clearly form a layer 441 or a band 441 with reactive ions which is formed in the local vicinity of the interstitials 201 above the amorphous/crystalline interface 108. The reactive ions 440 may react (e.g., to form clusters) with interstitials 201 which have not already been eliminated by the micro-cavities 420 and diffuse in the direction of the substrate surface, wherein the interstitials 201 are trapped or eliminated, which is illustrated by the arrows 440a in FIG. 4.

Therefore, the interstitials are clearly "attacked" from two sides (i.e., on one side from below the EOR defect region 202 by means of the micro-cavities 420, and on the other side from above the EOR defect region 202 by means of the reactive ions 440) and are thus effectively eliminated.

FIG. 5 symbolically illustrates, in a fifth diagram 500, the final state following elimination of the interstitials 201, wherein it is assumed that micro-cavities 420 and reactive ions 440 are still present in the substrate even after the elimination of the interstitials 201.

Figure 6A:
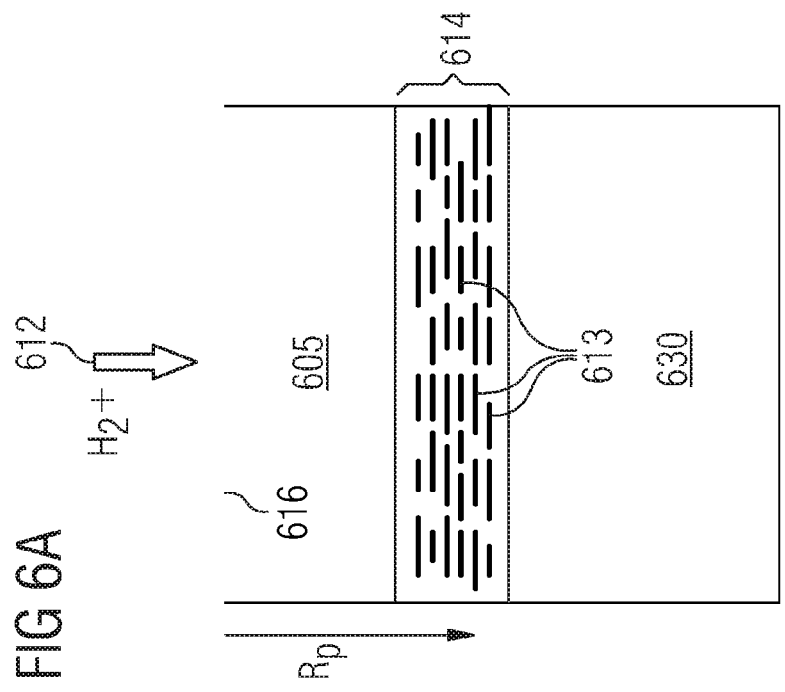

FIG. 6A shows a first view for illustrating a method for fabricating a semiconductor element in a substrate in accordance with an embodiment. A field-effect transistor is fabricated in accordance with the embodiment shown.

The implantation of light ions 612, $H_2^+$ ions in the embodiment shown, into a silicon substrate 630 is shown. In accordance with alternative embodiments, $He^+$ ions, $Ne^+$ ions or $F^+$ ions may be implanted as light ions 612. The implantation of the $H_2^+$ ions as light ions 612 may be effected, for example, with an implantation dose of $\Phi=10^{13}$ cm$^{-2}$ to $10^{17}$ cm$^{-2}$ and an implantation energy of E=5 keV to 40 keV. By means of the implanted light ions 612, covalent silicon bonds in the substrate 630 are broken and micro-platelets 613 are formed, for example, in a narrow band 614 centered around the concentration maximum, clearly the range (projected range) $R_p$, of the light ions 612. $R_p$ and thus the depth of the band 614 with the micro-platelets 613 may be altered by altering the parameters of dose $\Phi$ and energy E. The parameters of dose $\Phi$ and energy E may be chosen in such a way that the micro-platelets 613 are formed below the channel region 605 of the transistor to be formed. Furthermore, the implantation parameters ($\Phi$, E) may be chosen in such a way that the micro-platelets 613 are formed below a region in which end-of-range defects (EOR defects) are formed in the context of a (subsequent) pre-amorphization implantation (see FIG. 6D).

As shown in FIG. 6A, the micro-platelets 613 are stretched along a plane parallel to the surface 616 of the substrate 630. In the case of a (100) substrate used in accordance with one embodiment, the micro-platelets 613 may be stretched, e.g., along the (100) plane or the (111) plane, wherein the lengths of the individual micro-platelets 613 are distributed around a statistical mean value, which is illustrated in FIG. 7.

Figure 7:
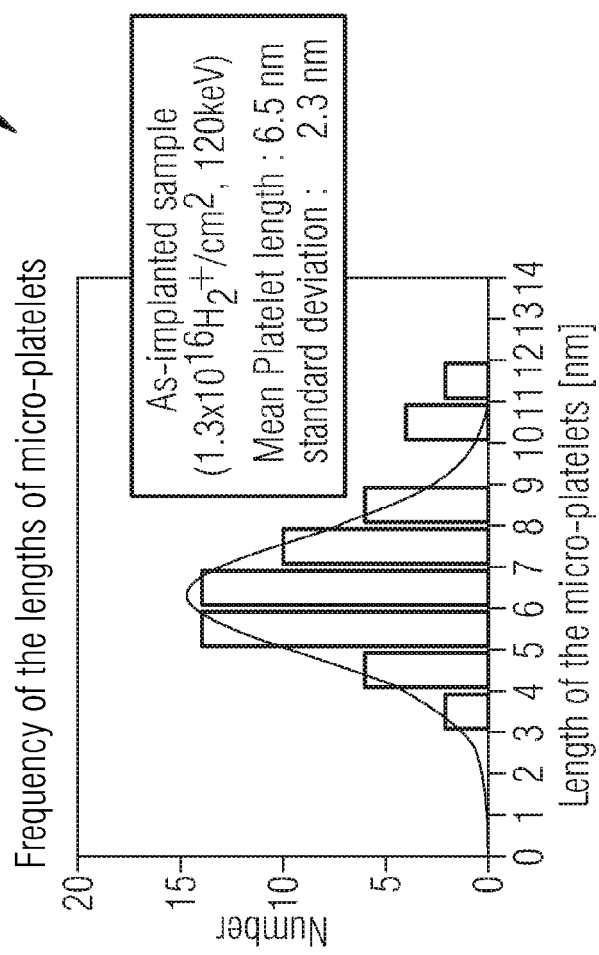
FIG. 7 shows a length distribution of micro-platelets.

FIG. 7 shows a frequency distribution 700 of the lengths of micro-platelets or platelet-like defects which were formed by the implantation of $H_2^+$ ions with an implantation dose $\Phi=1.3\times10^{16}$ cm$^{-2}$ and an implantation energy E=120 keV. A mean platelet length of approximately 6.5 nm and a standard deviation of the platelet length of approximately 2.3 nm are apparent from the frequency distribution 700.

If desired, it may be possible to use a hard mask composed of an oxide layer and a nitride layer formed on the oxide layer, which may be patterned in such a way that the lateral extent of the region in which the micro-platelets 613 are formed may be limited to the area of the highly doped source/drain regions to be formed, which regions are formed as an ultra-shallow junction. To put it another way, what may be achieved by means of the hard mask is that micro-platelets 613 are formed below the source/drain regions of the field-effect transistor. The mask may have a size similar to the desired lateral extent of the source/drain regions.

FIG. 6B shows another view for illustrating the method for fabricating a field-effect transistor in accordance with the embodiment. It is shown a first thermal treatment (identified by the arrow 610) of the substrate 630 with the micro-platelets 613 formed, to put it another way a first heat treatment step or annealing step, applied to the substrate 630 and the micro-platelets 613 formed, at a temperature T=700° C. and with a time duration t=60 min, i.e., with a low thermal budget.

As a result of the first thermal treatment 610, an outdiffusion of the implanted light ions in the form of neutral atoms or molecules occurs, in the form of hydrogen molecules ($H_2$ molecules) in the embodiment shown, and a network or a band 624' with micro-cavities 620' is formed from the band 614 with the micro-platelets 613. The temperature T and the time duration t of the annealing step shown in FIG. 6B are only by way of example and may be optimized, for example, to the effect that the density and the size of the micro-cavities 620' formed do not exceed predetermined threshold values, such that, for example, a delamination of the substrate 630 is avoided.

FIG. 8 shows a cross-sectional transmission electron microscopy (XTEM) micrograph 800, in which the micro-cavities 620' formed after the first thermal treatment can be discerned.

FIG. 6C shows another view for illustrating the method for fabricating a field-effect transistor in accordance with the embodiment. It is shown shows a second thermal treatment (identified by the arrow 615) of the substrate 630 with the micro-cavities 620' formed, to put it another way a second heat treatment step or annealing step applied to the substrate 630 and the micro-cavities 620' formed, in the course of which the substrate 630 is heated to a temperature of T=1100° C. for a time duration of t=1 s. The second thermal treatment 615 initiates a conservative ripening process of the micro-cavities 620' formed in the substrate 630, in the course of which process, from the band 624' with the large number of relatively small micro-cavities 620', a narrower band 624 with a small number of large micro-cavities 620 is formed.

FIG. 9 shows an XTEM micrograph 900 of the large micro-cavities 620 formed after the second thermal treatment 615. The large micro-cavities 620 may have a dimensioning of approximately between 5 nm and 100 nm, for example, approximately between 10 nm and 200 nm, in a first dimension, a dimensioning of approximately between 20 nm and 100 nm in a second dimension, and a dimensioning of approximately between 10 nm and 200 nm, for example, approximately between 50 nm and 100 nm, in a third dimension.

FIG. 6D shows another view for illustrating the method for fabricating a field-effect transistor in accordance with the embodiment.

A pre-amorphization of a surface region of the field-effect transistor as far as a depth of approximately 50 nm to 200 nm, for example as far as a depth of approximately 100 nm, is shown. The pre-amorphization is effected by means of implanting pre-amorphization ions 622, germanium ions ($Ge^+$ ions) in the embodiment shown, into the substrate 630. The concentration profile of the implanted germanium atoms is schematically illustrated by means of the curve 604 in FIG. 6D (also see curve 104 in FIG. 1). The pre-amorphization has the effect that the (100) silicon substrate 630, which was originally monocrystalline, now has a crystalline partial region 606 and an amorphous partial region 603 extending approximately as far as the micro-cavities 620, wherein an approximate distance between the micro-cavities 620 and the lower boundary 608 of the amorphous region 603 in the depth direction of the substrate 630 is, for example, approximately 10 nm to 20 nm. As an alternative, a (111) silicon substrate may also be used. The implantation of the germanium ions as pre-amorphization ions 622 may be effected, for example, with an implantation dose of $\Phi=10^{14}$ cm$^{-2}$ to $10^{15}$ cm$^{-2}$ and with an implantation energy of E=20 keV to 50 keV.

As a result of the implantation of the pre-amorphization ions 622 into the substrate 630, crystal defects in the form of interstitials 601 are produced in the substrate 630, which has been thoroughly described further above in connection with FIG. 1. In this case, the interstitials 601 are predominantly formed below the amorphous/crystalline interface 608 (i.e. below the interface 608 between the amorphous partial region 603 and the crystalline partial region 606 of the substrate 630) in a region 602 corresponding to the tail of the Ge implantation profile 604 (see description concerning FIG. 1), and may also be referred to as end-of-range interstitials (EOR defects) 601.

It should be noted in this connection that the process of forming the micro-cavities 620 as described in connection with FIG. 6A to FIG. 6C may be effected in such a way that the micro-cavities 620 are formed in the crystalline partial region 606 of the substrate 630 and below the region 602 with the interstitials 601, in other words deeper in the substrate 630 than the end-of-range interstitials 601.

FIG. 6E shows another view for illustrating the method for fabricating a field-effect transistor in accordance with the embodiment.

An implantation of reactive ions 632, Cl$^+$ ions in the embodiment shown, into the amorphous partial region 603 of the substrate 630 is shown, whereby a layer 641 with reactive ions 640 is formed in the amorphous partial region 603 above the amorphous/crystalline interface 608. The implantation of the Cl$^+$ ions as reactive ions 632 may be effected, for example, with an implantation dose of approximately between $10^{13}$ cm$^{-2}$ and $5\times10^{16}$ cm$^{-2}$ and with an implantation energy of approximately between 10 keV and 50 keV. The implantation dose and/or the implantation energy of the Cl$^+$ ions, generally of the reactive ions 632, may be chosen in such a way that the implanted reactive ions 640 or the layer 641 with the reactive ions 640 are or is at a distance of, for example, approximately between 10 nm and 100 nm, for example, approximately 50 nm, from the amorphous/crystalline interface 608.

FIG. 6F shows another view for illustrating the method for fabricating a field-effect transistor in accordance with the embodiment.

The formation of a gate structure 650 (also referred to as gate stack or gate module) is shown. The gate structure 650 is formed in a manner known per se by oxidizing the main processing surface 616 of the silicon substrate 630 and applying a polysilicon layer thereto. By means of patterning the polysilicon layer and the silicon dioxide layer, the gate structure 650 is formed with a gate oxide 650a and a gate electrode 650b composed of polysilicon.

FIG. 6G shows another view for illustrating the method for fabricating a field-effect transistor in accordance with the embodiment.

It is shown the implantation of boron atoms as dopant atoms into the amorphous partial region 603 of the substrate 630 using boron ions 642 (B$^+$ ions) and furthermore using the gate structure 650 as a mask, such that highly doped (in this case highly p-doped, e.g., p$^+$-doped) connection regions, i.e., source/drain regions, 651, 652 of the field-effect transistor are formed in the amorphous partial region 603 alongside the gate structure 650. The boron atoms may be implanted using a low or very low implantation energy, such that the source/drain regions 651, 652 of the field-effect transistor are formed as shallow or ultra-shallow highly doped regions and shallow or ultra-shallow junctions (e.g., p$^+$/n junctions) are thereby formed in the field-effect transistor.

It should be noted in this connection that the process of implanting the reactive ions 632 as described in connection with FIG. 6E may be effected in such a way that the layer 641 with the implanted reactive ions 640 is sufficiently far away from one or more p$^+$/n junctions in the field-effect transistor, such that the occurrence of leakage currents in the field-effect transistor may be avoided.

Figure 6H:
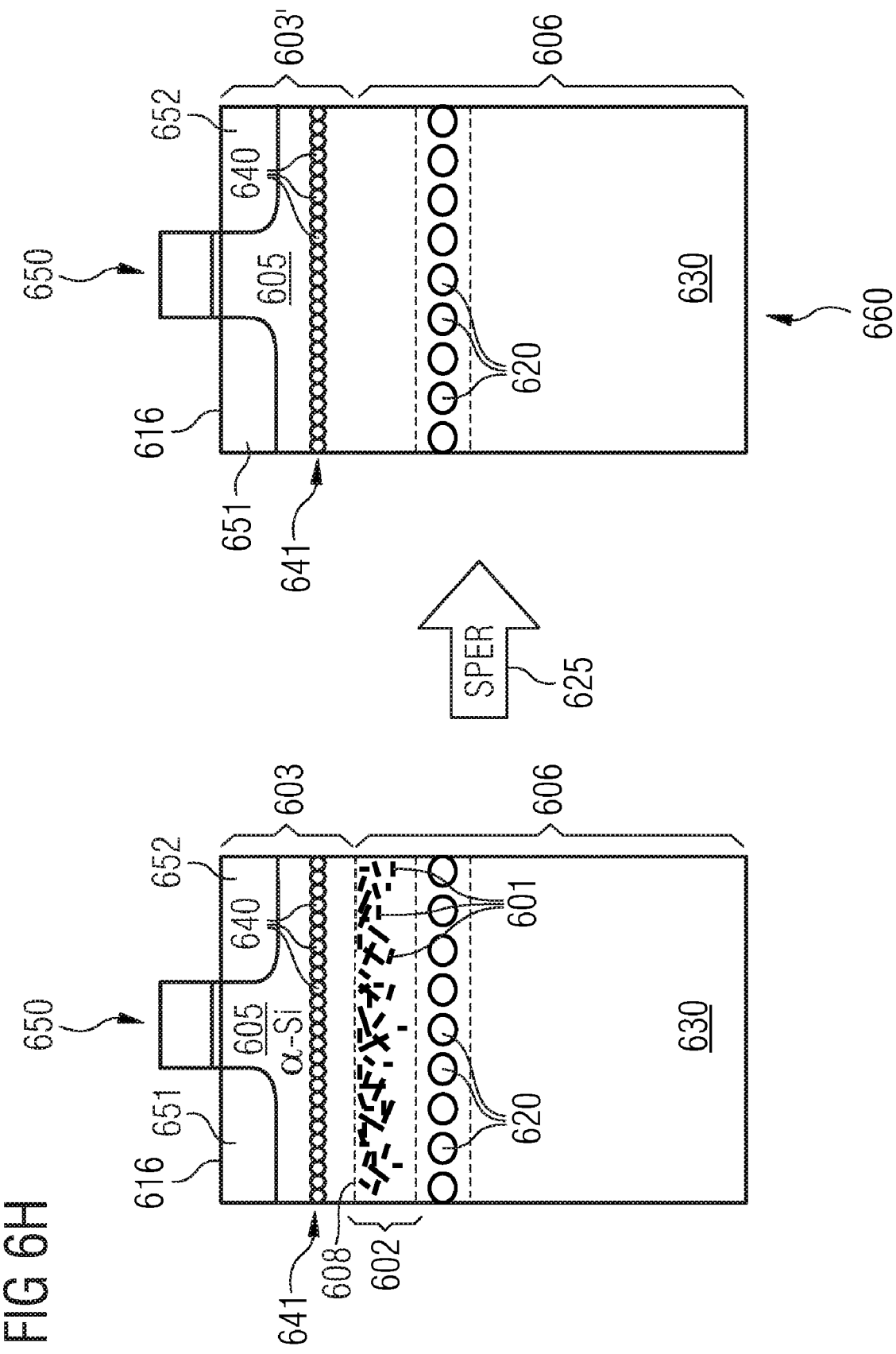

FIG. 6H shows another view for illustrating the method for fabricating a field-effect transistor in accordance with the embodiment.

It is shown a third thermal treatment (identified by the arrow 625) of the substrate 630 in the context of a solid phase epitaxial regrowth (SPER) process for annealing the crystal lattice damage caused by the pre-amorphization implantation 622 in the amorphous partial region 603 of the substrate 630. To put it another way, at least partial recrystallization of the amorphous partial region 603 may be brought about by means of the third thermal treatment, such that a fully or at least partially crystalline region 603' is formed from the amorphous region 603. The third thermal treatment 625 may be configured as a heat treatment with a low thermal budget (e.g. as a low temperature anneal). By way of example, the substrate 630 may be heated to a temperature of approximately 600° C. for a duration of approximately 30 min in the context of the third thermal treatment.

A thermal activation of the end-of-range defects 601 or interstitials 601 of the region 602 which is effected in the context of the third thermal treatment 625 may then have the effect that the interstitials 601 diffuse from the region 602 both in the direction of the substrate bulk and in the direction of the substrate surface 616. As already described further above in connection with FIG. 4 and FIG. 5, however, the interstitials 601 are completely or almost completely eliminated by the micro-cavities 620 formed below the region 602 and by the reactive ions 640 introduced above the region 602 and, consequently, the flow of interstitials 601 in the direction of the substrate surface 616 is completely or almost completely prevented since the micro-cavities 620 clearly serve as a sink for the interstitials 601 and, in addition, the reactive ions 640 react with diffusing interstitials 601 (e.g., to form clusters). This prevents interstitials 601 from reaching the shallow doped connection regions 651, 652 by means of diffusion, thereby preventing the TED and deactivation of the dopant atoms introduced into the regions 651 and 652.

Consequently, by means of the method described, a field-effect transistor 660 is completed which, in comparison with conventional field-effect transistors, has fewer or even no longer any interstitials 601 (which is illustrated schematically in FIG. 6H by the absence of the interstitials 601 after the third thermal treatment 625), and in which the TED and the deactivation of the dopant atoms are likewise reduced compared with conventional field-effect transistors.

In accordance with the embodiment described in connection with FIGS. 6A to 6H, the implantation of the light ions 612 for forming the micro-cavities 620 and the implantation of the reactive ions 632 are effected prior to forming the gate structure 650 of the field-effect transistor. Since, in accordance with this embodiment, the gate structure 650 is not yet present at the time when the light ions 612 are implanted, in this case it is possible, for example, to dispense with a mask which may otherwise be applied for protecting the gate structure 650 against the (high-energy) light ions 612. The costs and the complexity of the fabrication method may thus be reduced.

In accordance with alternative embodiments, the gate structure may be formed before the micro-cavities are formed and before the reactive ions are implanted. In this case, during the implantation of the (high-energy) light ions, the gate structure may be protected against damage by the implantation, for example, using a mask. The process for forming the micro-cavities and the process of introducing the reactive ions into the amorphous partial region of the substrate may be effected in a manner analogous to that described above, where it should be noted that in this case the gate structure acts as a mask, for example, in the context of the light ion implantation and, consequently, a region below the gate structure remains free of the implanted light ions.

FIG. 10 shows a method 1000 for fabricating a semiconductor element in a substrate in accordance with an embodiment.

In 1020, first implantation ions are implanted into the substrate, whereby micro-cavities are produced in a first partial region of the substrate. The process of implanting the first implantation ions may be effected in accordance with one or more of the embodiments described herein.

In 1040, pre-amorphization ions are implanted into the substrate, whereby a second partial region of the substrate is at least partly amorphized, and whereby crystal defects are produced in the substrate. The process of implanting the pre-amorphization ions may be effected in accordance with one or more of the embodiments described herein.

In 1060, second implantation ions are implanted into the second partial region of the substrate. The process of implanting the second implantation ions may be effected in accordance with one or more of the embodiments described herein.

In 1080, the substrate is heated, such that at least some of the crystal defects are eliminated using the micro-cavities and/or the second implantation ions. The process of heating the substrate may be effected in accordance with one or more of the embodiments described herein.

In 1100, dopant atoms are implanted into the second partial region of the substrate, wherein the semiconductor element is formed using the dopant atoms. The process of implanting the dopant atoms may be effected in accordance with one or more of the embodiments described herein.

In the following, certain features and potential effects of illustrative embodiments are described.

In accordance with some embodiments, a flow or diffusion of interstitials which may arise during the fabrication of a semiconductor element in the direction of the substrate surface of the semiconductor element may be completely or at least partially suppressed.

In accordance with one embodiment, for this purpose a band with micro-cavities may be formed on the crystalline side of the amorphous/crystalline interface deep in the substrate of the semiconductor element, and a shallower layer with highly reactive ions may be formed on the amorphous side of the amorphous/crystalline interface in the amorphized partial region of the substrate.

In accordance with another embodiment, the micro-cavities may be formed by means of implanting light ions such as, for example, $H_2^+$ ions, $He^+$ ions, $Ne^+$ ions or $F^+$ ions, and the layer with the highly reactive ions may be formed by means of implanting reactive or highly reactive ions such as, for example, $C^+$ ions, $N^+$ ions or $Cl^+$ ions.

In the context of this application, the combination of a light ion implantation (for forming the micro-cavities) with an implantation of reactive ions (for forming the reactive layer) is also referred to as clever cocktail implantation. The light ions are responsible for the nucleation and the growth of the micro-cavities, while the highly reactive ions are responsible for the formation of pairs or clusters with interstitials which cross the amorphous/crystalline interface.

In accordance with some embodiments, in the context of the clever cocktail implantation described above, it is possible to use, for example, the combinations of implantation ions listed in tabular form below:

F+low T+Ge+Cl,
$H_2^+$low T+Ge+Cl,
He+low T+Ge+Cl,
F+low T+Ge+C,
$H_2^+$low T+Ge+C,
He+low T+Ge+C,
F+low T+Ge+N,
$H_2^+$low T+Ge+N,
He+low T+Ge+N, wherein the elements (F, $H_2$, He) mentioned in the first column may be used as first implantation ions (light ions) for forming the micro-cavities, "low T" denotes a low temperature process step effected after the implantation of the first implantation ions, "Ge" denotes the use of $Ge^+$ ions as pre-amorphization ions in the context of a pre-amorphization implantation, and the elements (Cl, C, N) mentioned in the fourth column may be used as second implantation ions (reactive ions).

In the embodiments mentioned above, three implant species are combined with one another (including the Ge pre-amorphization ions but without taking into account a dopant implantation (e.g., boron implantation)).

In accordance with alternative embodiments, in the context of the clever cocktail implantation, two different implant species may be used together in the implantation of the reactive ions. When using two implant species for the implantation of the reactive ions (second implantation ions), it is therefore possible to use a total of four implant species (including the pre-amorphization ions but without taking into account a dopant implantation) in the context of the clever cocktail implantation, such as, for example, the following combinations:

F+low T+Ge+C+N,
F+low T+Ge+Cl+N,
$H_2^+$low T+Ge+F+N,
$H_2^+$low T+Ge+C+N,
$H_2^+$low T+Ge+Cl+N,
He+low T+Ge+F+N,
He+low T+Ge+Cl+N,
He+low T+Ge+C+N, wherein the elements (C, N, Cl, F) mentioned in the fourth and fifth columns of the tabular enumeration indicated above are in each case used as second implantation ions. That is to say that, in accordance with the embodiment mentioned in the first row, carbon ions ($C^+$ ions) and nitrogen ions ($N^+$ ions) may be used jointly as second implantation ions, and in accordance with the embodiment mentioned in the second row, chlorine ions ($Cl^+$ ions) and nitrogen ions ($N^+$ ions) may be used jointly as second implantation ions, and in accordance with the embodiment mentioned in the third row, fluorine ions ($F^+$ ions) and nitrogen ions ($N^+$ ions) may be used jointly as second implantation ions, etc.

As can be gathered, for example, from the third row and the sixth row of the tabular enumeration indicated above, during the implantation of the second implantation ions, reactive ions (for example, $N^+$ ions) may also be implanted jointly with light ions (for example, $F^+$ ions), wherein the light ions (for example, the $F^+$ ions) in this case may clearly also act as reactive ions.

In accordance with alternative embodiments, in the context of the clever cocktail implantation, it is also possible to use different combinations of implant species from those presented by way of example above.

In accordance with some embodiments, process sequences are specified which may be integrated into a customary CMOS process in a very simple manner.

In accordance with some embodiments, no negative effect is produced with regard to the performance of the semiconductor element formed, for example, of the field-effect transistor formed, since the micro-cavities formed lie at a sufficiently large distance from the $p^+/n$ junctions of the ultra-shallow junctions.

In accordance with some embodiments, the TED and the deactivation of the dopant atoms may be considerably reduced as a direct consequence of the reduction of the EOR defects.

In accordance with some embodiments, it may be possible to carry out ultra-fast thermal processes such as, for example, laser heating or flash heating at a temperature of less than 1300° C., whereby dielectric degradation problems may be avoided.

In accordance with some embodiments, it may be possible to use a rapid thermal heating (Rapid Thermal Annealing, RTA) instead of a laser heating or flash heating.

What is claimed is:

1. A method for fabricating a semiconductor element in a substrate, the method comprising:
    implanting first implantation ions into the substrate, whereby micro-cavities are produced in a first partial region of the substrate;
    implanting pre-amorphization ions into the substrate, whereby a second partial region of the substrate is at least partly amorphized, and whereby crystal defects are produced in the substrate;
    implanting second implantation ions into the second partial region of the substrate, wherein the second implantation ions comprise reactive ions, wherein the reactive ions are selected from the group consisting of Cl+ ions and N+ ions;
    heating the substrate, such that at least some of the crystal defects are eliminated using the second implantation ions; and
    implanting dopant atoms into the second partial region of the substrate, wherein the semiconductor element is formed using the dopant atoms.

2. The method according to claim 1, wherein heating the substrate comprises heating the substrate such that the crystal defects are eliminated using the second implantation ions and the micro-cavities.

3. The method according to claim 1, wherein the micro-cavities are produced below a region in which the crystal defects are produced.

4. The method according to claim 1, wherein implanting the first implantation ions causes micro-platelets to be formed in the first partial region of the substrate and wherein the micro-cavities are formed from the micro-platelets.

5. The method according to claim 4, wherein the substrate with the micro-platelets is subjected to a first thermal treatment, such that the micro-cavities are formed.

6. The method according to claim 5, further comprising forming a second thermal treatment after the first thermal treatment, whereby the size of the micro-cavities formed is increased or the number of micro-cavities formed is reduced, or both, in the context of a ripening process.

7. The method according to claim 1, wherein the first implantation ions comprise light ions.

8. The method according to claim 7, wherein the light ions are selected from the group consisting of:
    $H_2^+$ ions;
    $He^+$ ions;
    $F^+$ ions; and
    $Ne^+$ ions.

9. The method according to claim 1, wherein implanting the pre-amorphization ions is performed after implanting the first implantation ions.

10. The method according to claim 1, wherein the pre-amorphization ions comprise germanium ions or silicon ions.

11. The method according to claim 1, wherein the second implantation ions are implanted after the implantation of the pre-amorphization ions.

12. The method according to claim 1, wherein the second implantation ions are implanted in such a way that the second implanted ions are at a distance of approximately 10 nm to 100 nm from an interface between the at least partly amorphized second partial region and a crystalline partial region of the substrate that is formed below the second partial region.

13. The method according to claim 1, wherein the reactive ions are implanted with an implantation dose of between $10^{13}$ $cm^{-2}$ and $5 \times 10^{16}$ $cm^{-2}$.

14. The method according to claim claim 1, wherein the reactive ions have an implantation energy of approximately 4 keV to 50 keV.

15. The method according to claim 1, wherein the dopant atoms are implanted after the process of implanting the second implantation ions.

16. The method according to claim 1, wherein the pre-amorphization ions are implanted after the process of forming the micro-cavities.

17. The method according to claim 1, wherein the substrate is subjected to a third thermal treatment after the dopant atoms have been implanted, such that the at least partly amorphized second partial region is at least partly recrystallized.

18. The method according to claim 1, wherein at least one region of the second partial region into which the dopant atoms are implanted forms a shallow junction of the semiconductor element.

19. The method according to claim 18, wherein the at least one region of the second partial region into which the dopant atoms are implanted forms a source region or a drain region of a field-effect transistor.

20. The method according to claim 1, wherein the method comprises a CMOS process for fabricating a field-effect transistor.

21. The method according to claim 20, wherein the CMOS process is a CMOS logic process or a DRAM process.

* * * * *